United States Patent
Grosch et al.

(10) Patent No.: US 8,854,073 B2
(45) Date of Patent: Oct. 7, 2014

(54) METHODS AND APPARATUS FOR MARGIN TESTING INTEGRATED CIRCUITS USING ASYNCHRONOUSLY TIMED VARIED SUPPLY VOLTAGE AND TEST PATTERNS

(75) Inventors: David A. Grosch, Burlington, VT (US); Marc D. Knox, Hinesburg, VT (US); Erik A. Nelson, Waterbury, VT (US); Brian C. Noble, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 13/236,696

(22) Filed: Sep. 20, 2011

(65) Prior Publication Data
US 2013/0069678 A1    Mar. 21, 2013

(51) Int. Cl.
G01R 31/02 (2006.01)
G01R 31/3187 (2006.01)
G01R 31/30 (2006.01)

(52) U.S. Cl.
CPC ............ G01R 31/30 (2013.01); G01R 31/3004 (2013.01)
USPC ............... 324/762.02; 324/762.01; 324/750.3

(58) Field of Classification Search
CPC .... G01R 31/00; G01R 31/26; G01R 31/2607; G01R 31/2642; G01R 31/30; G01R 31/3136; G01R 31/3012; G01R 31/3004; G01R 31/2856; G01R 31/2879; G01R 31/3173
See application file for complete search history.

(56) References Cited

U.S. PATENT DOCUMENTS

| | | | |
|---|---|---|---|
| 6,122,760 A * | 9/2000 | Grosch et al. ............... | 714/724 |
| 6,574,760 B1 * | 6/2003 | Mydill ......................... | 714/724 |
| 6,901,542 B2 | 5/2005 | Bartenstein et al. | |
| 6,971,054 B2 | 11/2005 | Kurtulik et al. | |
| 7,076,710 B2 * | 7/2006 | Knips et al. .................... | 714/734 |
| 7,225,374 B2 | 5/2007 | Burdine et al. | |
| 7,234,090 B2 | 6/2007 | Blasi et al. | |
| 7,428,675 B2 | 9/2008 | Gattiker et al. | |
| 7,486,096 B2 * | 2/2009 | Dhong et al. .............. | 324/750.3 |
| 7,701,801 B2 | 4/2010 | Joshi et al. | |
| 7,774,662 B2 | 8/2010 | Motika et al. | |
| 2001/0038570 A1 * | 11/2001 | Nakano et al. ................. | 365/233 |
| 2008/0082873 A1 * | 4/2008 | Russell et al. ................. | 714/721 |
| 2010/0095169 A1 | 4/2010 | Forlenza et al. | |
| 2010/0095177 A1 | 4/2010 | Forlenza et al. | |

OTHER PUBLICATIONS

Tor Erik Leistad, Delay-Fault BIST in Low-Power CMOS Devices, Norwegian University of Science and Technology, Jun. 2008, 102 pages (p. 2 not submitted—blank).

* cited by examiner

Primary Examiner — Vinh Nguyen
(74) Attorney, Agent, or Firm — Schmeiser, Olsen & Watts; Michael LeStrange

(57) ABSTRACT

Method and apparatus for margin testing integrated circuits. The method includes selecting a clock frequency, an operating temperature range and a power supply voltage level for margin testing an integrated circuit wherein one or more of the clock frequency, the operating temperature range and the power supply voltage level is outside of the normal operating conditions of the integrated circuit; applying an asynchronously time varying power supply voltage set to the selected power supply voltage level to the integrated circuit; running the integrated circuit chip at the selected clock frequency and maintaining the integrated circuit within the selected temperature range; applying a continuous test pattern to the integrated circuit; and monitoring the integrated circuit for fails.

25 Claims, 8 Drawing Sheets

METHODS AND APPARATUS FOR MARGIN TESTING INTEGRATED CIRCUITS USING ASYNCHRONOUSLY TIMED VARIED SUPPLY VOLTAGE AND TEST PATTERNS

FIELD OF THE INVENTION

The present invention relates to the field of integrated circuit reliability testing; more specifically, it relates to efficient methods and apparatus for margin testing integrated circuits.

BACKGROUND

Conventional methods of reliability testing of integrated circuits requires the use of multiple test corners, long test times and present unacceptably high power consumption leading to higher than desired integrated circuit temperatures. Accordingly, there exists a need in the art to mitigate the deficiencies and limitations described hereinabove.

SUMMARY

A first aspect of the present invention is a method, comprising: selecting a clock frequency, an operating temperature range and a power supply voltage level for margin testing an integrated circuit wherein one or more of the clock frequency, the operating temperature range and the power supply voltage level is outside of the normal operating conditions of the integrated circuit; applying an asynchronously time varying power supply voltage set to the selected power supply voltage level to the integrated circuit; running the integrated circuit chip at the selected clock frequency and maintaining the integrated circuit within the selected temperature range; applying a continuous test pattern to the integrated circuit; and monitoring the integrated circuit for fails.

A second aspect of the present invention is a test apparatus comprising" a tester configured to apply an asynchronously time varying power supply voltage set to a selected power supply voltage level to an integrated circuit, configured to run the integrated circuit chip at a selected clock frequency, configured to maintain the integrated circuit within a selected temperature range, and configured to apply a continuous test pattern to the integrated circuit; wherein one or more of the selected clock frequency, the selected operating temperature and the selected power supply voltage level is outside of the normal operating conditions of the integrated circuit; and a test controller configured to monitor the integrated circuit for fails.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1:
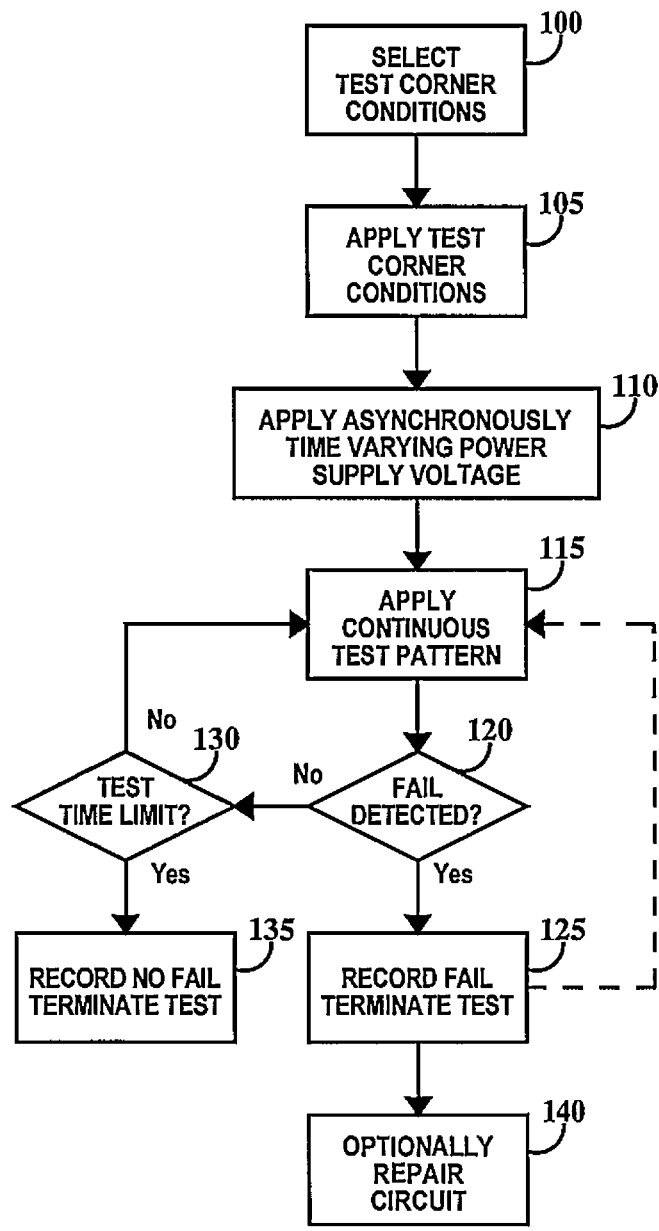
FIG. 1 is a flowchart of an embodiment of the present invention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The embodiments of the present invention utilize application of a continuous test pattern in combination with an asynchronous time varying power supply voltage at voltage and temperature margins to reliability test integrated circuit chips.

A test corner is defined as a specific set of applied test conditions (e.g., voltage, temperature, patterns, frequency) which when combined together, comprise a unique and discreet test application.

Memory repair is defined as, after identifying nonfunctional storage elements, invoking appropriate spare or redundant storage elements in place of the faulty ones. These repairs are sometimes referred to as bit line replacement, word line replacement, row repair, column repair, etc. In one example, word lines with failing bits are replaced by a redundant word line that is known good or is tested to confirm it is good. Redundant elements are the same as the elements they replace, but are not wired into the circuit unless selected as a repair element.

Logic repair is defined as, after identifying nonfunctional logic elements, invoking appropriate spare or redundant logic elements in place of the faulty ones. In one example individual devices (e.g., transistors) may be replaced with redundant devices. In one example, individual or groups of gates (e.g., AND, OR, NAND, NOR) may be replaced with redundant gates or groups of gates. In one example, entire logic functions (e.g., clock generator, phase lock loop generators, voltage dividers, etc.) may be replaced with redundant logic functions.

Automatic built-in self test (ABIST) is defined as the application of a memory built-in self test algorithm which is contained in the memory BIST engine. The algorithm applies test patterns to the memory array being tested. The test pattern may be a single repeated pattern or repeated multiple sequential patterns.

Logic built-in self test (LBIST) is defined as the application of a memory built-in self test algorithm which is contained in the logic BIST engine. The algorithm applies test patterns to the logic circuits being tested. The test pattern may be a single repeated pattern or repeated multiple sequential patterns.

Application space is defined as the environment of an integrated circuit in the actual hardware application in which it is used. The application space includes any possible extremes of voltages applied, frequency of operation, local temperatures and the processing workload.

Margin testing is defined as testing of circuit functionality under conditions outside of the normal (e.g., designed) operating conditions of the integrated circuit. Margin testing is performed with one or more of the integrated circuits operating parameters of clock frequency, temperature or power supply voltage level higher or lower than the normal clock frequency, temperature or power supply voltage level of the integrated circuit. The value of the margin parameters should be higher or lower than the specified normal operating parameters. For example, if the normal operating voltage is 1.2 volts, the margin power supply voltage could be 0.8 volts or 1.6 volts. For example, if the normal operating frequency is 100 MHz, the margin frequency could be 80 MHz volts or 120 MHz. For example, if the normal operating temperature is 85° C., the margin temperature could be 105° C. or 65° C. When an asynchronous time varying power supply is used, the corner power supply voltage level is the maximum (or minimum) voltage of the asynchronous time varying power supply. The tests themselves include, but are not limited to, bit fail and read and write time tests for memory circuits and functional, noise and signal delay tests for logic circuits.

FIG. 1 is a flowchart of an embodiment of the present invention. In step 100, the margin parameters and values of a test corner are selected. The conditions include, but are not limited to power supply voltage, temperature, clock frequency, and for memory, additionally refresh rate and read and write delay times. Again, the margin/test corner parameters are greater or less than the normal (or designed) circuit operating parameters. Selecting a margin voltage for the asynchronous time varying power supply includes selecting a base voltage, a stress voltage, a time the voltage is at Vstress (maximum voltage duration) and a time the voltage is at Vbase where the time at Vstress plus the time at Vbase are the period of the asynchronous time varying power supply voltage. See FIG. 3 and discussion infra. In one example, the embodiments of the present invention include a margin temperature, for example, 105° C. for a nominal operating temperature of 85° C. In step 105, the test corner conditions are applied to the integrated circuit being tested. The test corner conditions are applied by a tester. In step 110, the asynchronous time varying power supply voltage is applied to the integrated circuit being tested. The maximum voltage duration (time at Vstress) is less than the thermal time constant of silicon (when the integrated circuit is fabricated using silicon based devices/transistors). In step 115, a continuous test pattern is applied to the logic and/or memory circuits of the integrated circuit being tested. A test pattern is a sequence of logical 1's and 0's. In one example, a single pattern is repeated continuously (with no delays between patterns). In one example, a sequence of several patterns is repeated continuously (with no delays between sequences of patterns). The continuous test pattern may be applied by an ABIST engine, an LBIST engine or directly by the tester. The ABIST and LBIST test patterns are supplied by the tester. The test patterns supplied by the tester may be loaded into the tester or generated by an automatic test program generator (ATPG) residing in the tester.

In step 120, it is determined if a fail has occurred. If a fail has been detected, then in step 125, the fail locations on the integrated circuit are recorded as well as the test conditions at the time of the fail and the test terminates. If no fail has been detected in step 120, the method proceeds to step 130. In step 130, it is determined if the time allocated to testing the integrated circuit (or a particular test) has expired. If the time allocated has expired, the method loops back to step 115. If the time allocated to testing the integrated circuit (or a particular test) has not expired, the method proceeds to step 135 where no fail is recorded and the testing terminated. This is stop on fail or timeout testing. Optionally, after step 125, in step 140 a repair of the failing circuit is made. In one example, this is accomplished by replacing the failing circuit or circuit element with a redundant circuit or circuit element. Alternatively, instead of terminating the test in step 125, the method may loop back to step 115 (dashed line) and a list of fails accumulated until the test time limit is exceeded in step 130

Figure 2:
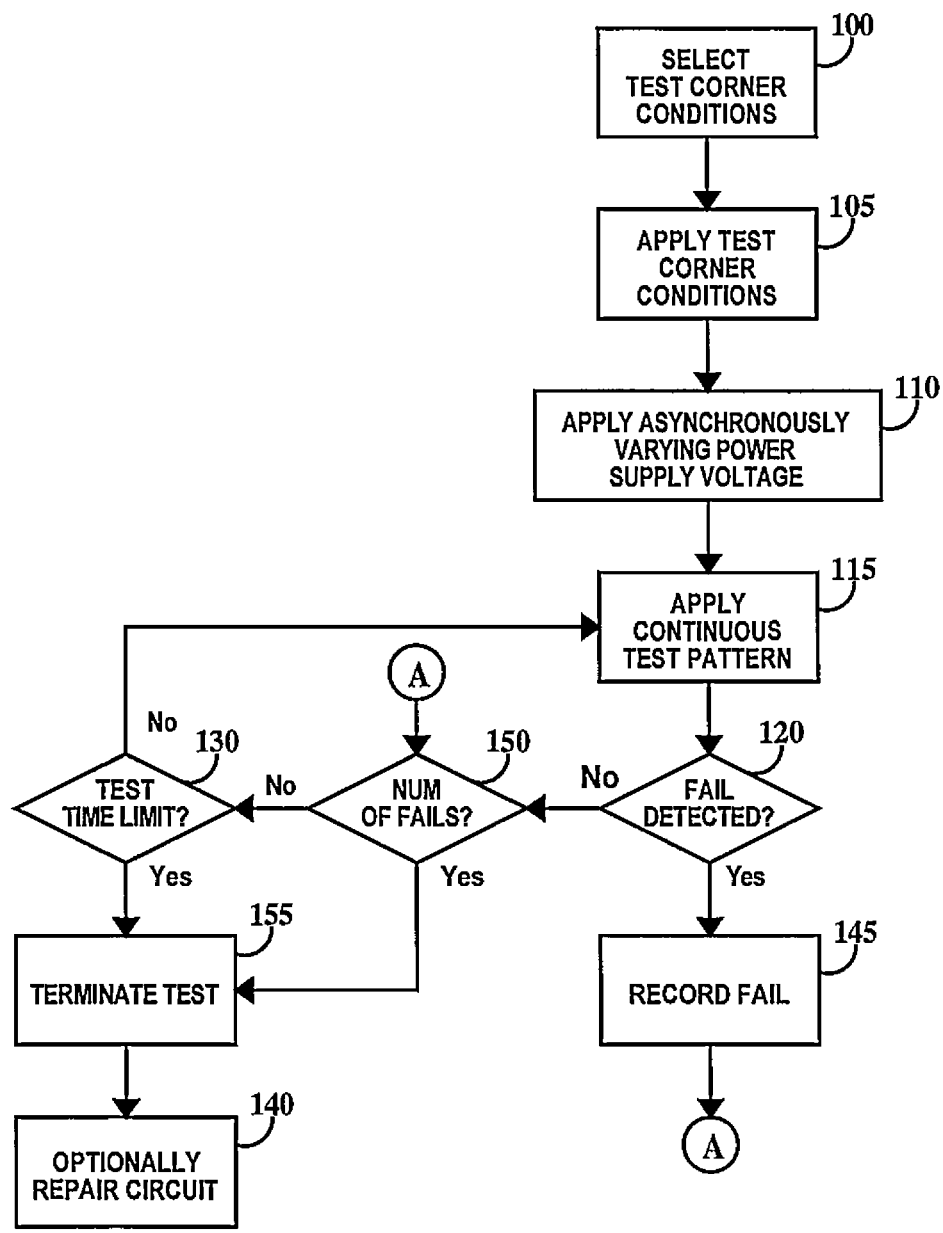
FIG. 2 is a flowchart of another embodiment of the present invention.

FIG. 2 is a flowchart of another embodiment of the present invention. The flowchart of FIG. 2 differs from the flowchart of FIG. 1 only in that it allows for multiple fails to be detected. Starting from step 120, if in step 120, a fail is detected, then is step 145 a fail is recorded (as in step 125 of FIG. 1) and the method proceeds to step 150 (via connector "A." In step 150, it is determined if the number of fails recorded has exceeded a maximum number. If the maximum number has been exceeded the method proceeds to step 155 where the test is terminated. After step 155, in step 140, if there were any fails, they may be optionally repaired. If in step 150, the maximum number of fails has not been exceeded then the method proceeds to step 130 which has been discussed supra with respect to FIG. 1.

Figure 3:
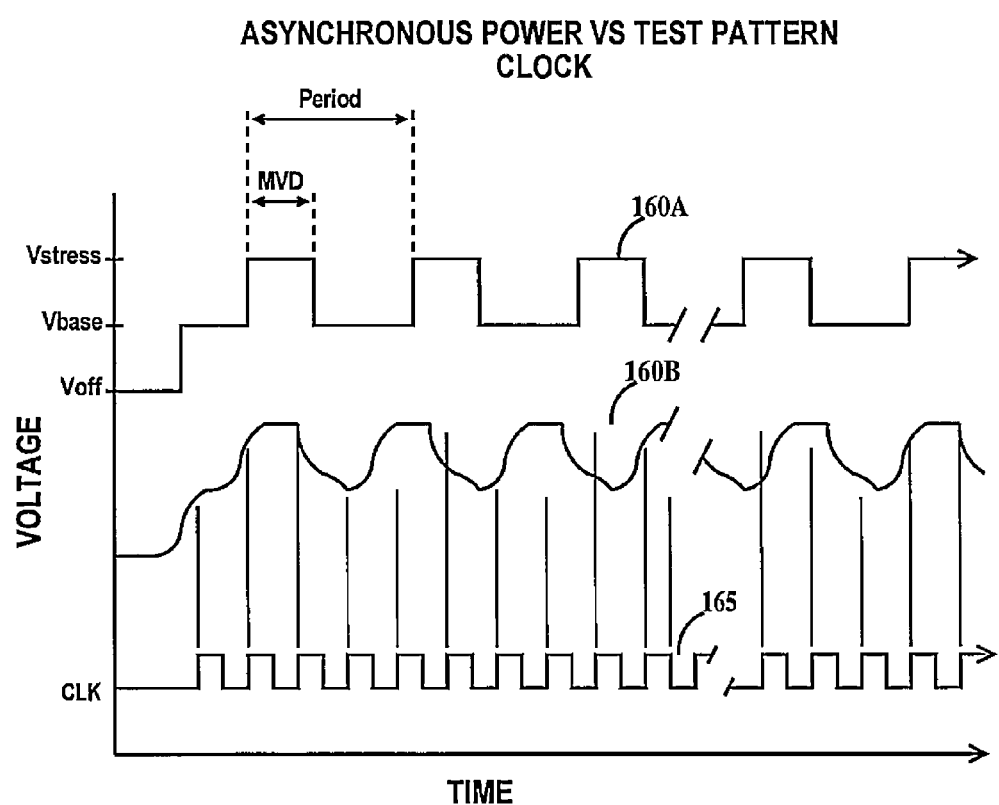
FIG. 3 are timing diagrams of asynchronous time varying power supply voltage versus test pattern clocking used by embodiments of the present invention.

FIG. 3 are timing diagrams of asynchronous time varying power supply voltage versus test pattern clocking used by embodiments of the present invention. In FIG. 3 an ideal asynchronous time varying power supply voltage 160A is illustrated. It is ideal in that all the transitions between stress and Vbase are vertical. The asynchronous time varying power supply voltage should not be confused with data signals or clock pulses. A data signal is synchronous with a clock signal such as the clock used to step the test patterns through the integrated circuit being tested, the asynchronous time varying power supply voltage is not synchronous with any clock or data signal. Further, a data signal is exerted high only to indicate a logical one, not on a regular repeating period such as a clock signal or synchronous time varying power supply voltage. Asynchronous time varying power supply voltage 160A starts at zero volts and varies between Vbase and Vstress. In one example, Vbase is the nominal voltage the circuit is designed to operate at while Vstress is a voltage higher than the circuit is designed for (i.e., is a high voltage stress corner). Thus, Vstress is a margin voltage. In one example, Vbase is a voltage lower than the circuit is designed for (i.e., is a low voltage stress corner) and Vstress is a voltage higher than the circuit is designed for (i.e., is a high voltage stress corner). Thus, both Vstress and Vbase are margin voltages. In the later example, when step 115 of FIG. 1 or 2 is performed, two voltage test corners are being applied at the same time, reducing test time and test cost.

The power is at Vstress for a period of time labeled in FIG. 3 "MVD" for maximum voltage duration. The time between rising edges of the Vbase to Vstress transition is the asynchronous time varying power supply voltage period. The asynchronous time varying power supply voltage is at a maximum voltage during MVD. The asynchronous time varying power supply voltage is at a minimum voltage during period-MVD. Note, at Voff the asynchronous time varying power supply is off and Voff is not the minimum voltage. In one example Voff is zero volts. In one example, the maximum voltage duration is between about 10% and about 90% of the period. In one example, the maximum voltage duration is about 50% of the period (e.g., the maximum and minimum voltages are about the same). The maximum voltage duration is selected, in one example, to keep the temperature of the integrated circuit between pre-defined minimum and maximum temperatures. This is particularly important when the test apparatus would be unable to keep the temperature of the integrated circuit below the pre-defined maximum temperature at very high test corners (e.g., constant power supply voltages that are greater than nominal operating voltages, running the test patterns at clock frequencies that are greater than nominal clock operating frequencies). The maximum voltage duration is always less than the thermal constant of substrate material the circuit being tested is formed in, for example, silicon, gallium arsenide (GaAs), sapphire or other semiconductor material. In one example, the thermal time constant ($\tau$) of a semiconductor material is given by:

$$\tau = \left[\frac{2F}{\pi}\right]^2 \left[\frac{\rho C}{K_{TH}}\right]$$

where:
F=thickness of the semiconductor material;
$\rho$=density of the semiconductor material;
C=specific heat of the semiconductor material; and
$K_{TH}$=thermal conductivity of the semiconductor material.
In one example, the thermal time constant of silicon is between tens of μsec and a few hundred μsec.

Asynchronous time varying power supply voltage 160B is the actual asynchronous time varying power supply voltage that the integrated circuit sees because there are rise and fall times associated between the Vbase/Vstress and Vstress/Vbase transitions. Clock signal 165 is a clock signal used to apply the continuous test pattern of step 115 of FIGS. 1 and 2. By comparing the rising edges of clock signal 165 to actual asynchronous time varying power supply voltage 160B is can be seen that the voltage when each data bit of the test pattern is applied varies asynchronously between Vbase and Vstress.

Figure 4:
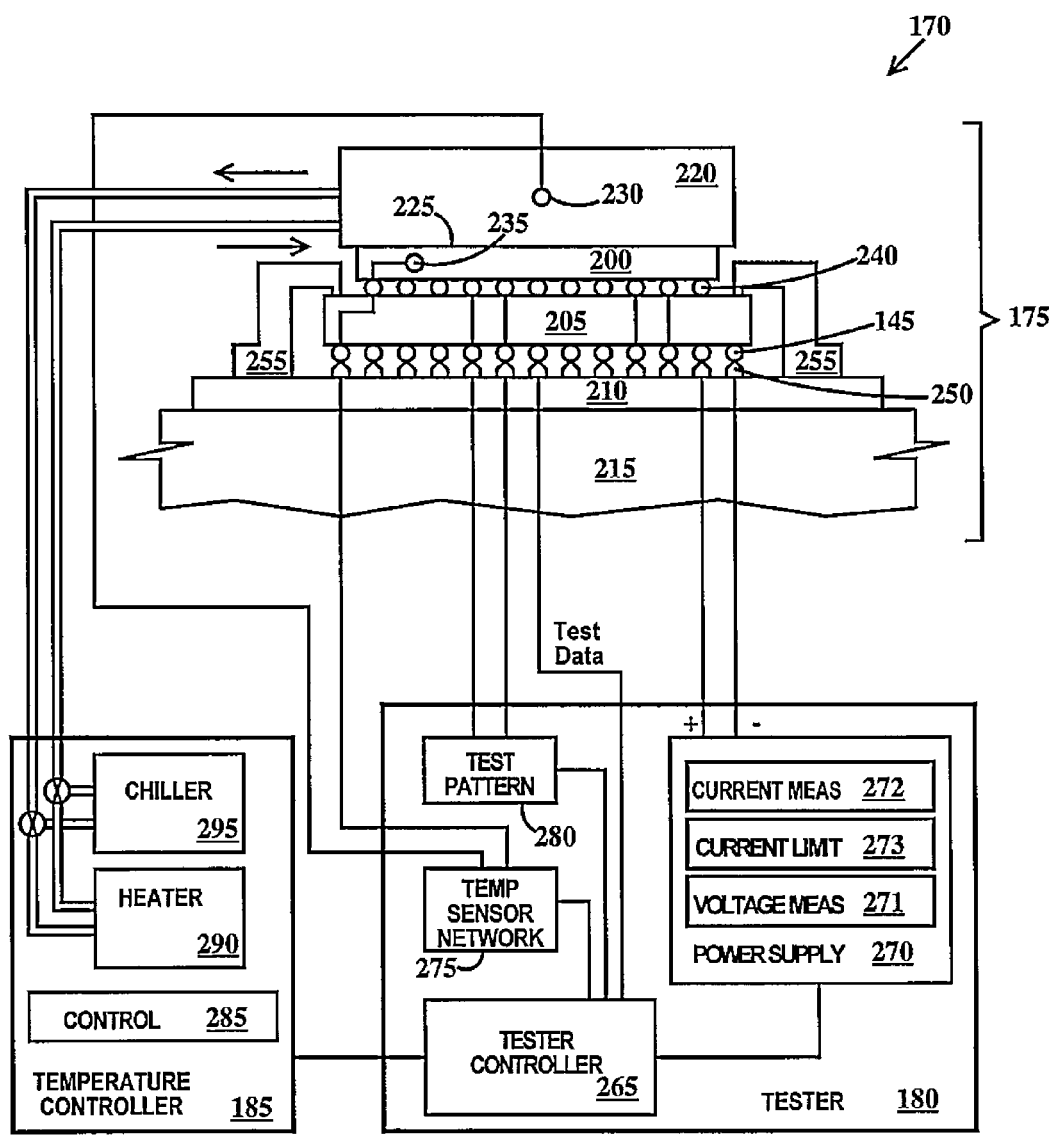
FIG. 4 is an exemplary diagram of a test apparatus for testing integrated circuits mounted on modules according to embodiments of the present invention.

FIG. 4 is an exemplary diagram of a test apparatus 170 for testing integrated circuits mounted on modules according to embodiments of the present invention. Test apparatus 170 includes a test head 175, a tester 180 and a temperature controller 185. In FIG. 4, an exemplary integrated circuit chip 200 to be stressed is mounted on a module 205 which in turn is removeably plugged into to a socket 210 of test head 175. Module 205 is mounted on a test fixture 215. Test fixture 215 may comprise a printed circuit board. Generally, a multiplicity of sockets 210 are mounted to test fixture 215 and a multiplicity of test fixtures are mounted in a rack (not shown) in a burn-in oven (not shown). An optional heat sink 220 capable of being heated or cooled as described infra, may be placed in temporary thermal contact with a bottom surface 225 of integrated circuit chip 200. Heat sink 220 includes an inlet and an outlet for circulating heating or cooling fluid through the heat sink. A thermal transfer medium may be placed between heat sink 220 and bottom surface 225 of integrated circuit chip 200. Heat sink 220 includes a heat sink temperature sensor 230 for measuring the temperature of the heat sink. Integrated circuit chip 200 may include an optional internal chip temperature sensor 235. A simple resistor wired to an appropriate circuit may be used to monitor the temperature of an integrated circuit.

Integrated circuit chip 200 is illustrated as a solder bump array chip in that a multiplicity of solder bumps 240 provide direct physical and electrical connection to pads (not shown) on substrate 205. Substrate 205 illustrates a ball grid array module in which balls 245 provide temporary direct physical and electrical connection to probes 250 of socket 210. Hard physical and low resistance electrical contact is maintained between balls 245 and probes 250 by pressure exerted by clip 255.

Tester 180 includes a tester controller 265 and a power supply 270. Power supply 270 includes a voltage measurement circuit 271, a current measurement circuit 272 and a current limiting circuit 273. Power supply 270 generates the asynchronous time varying power supply voltage and supplies the asynchronous time varying power supply voltage to the power pads of integrated circuit 200. Tester 180 also includes a temperature sensor network 275 for receiving signals from heat sink temperature sensor 230 and internal chip temperature sensor 235. Tester 180 also includes a test pattern unit 280 for applying test data signals to data I/O pads of integrated circuit chip 200. Test controller 265 monitors the current level, asynchronous time varying power supply voltage level and controls selection of test patterns and controls the timing of when the selected test patterns are applied to integrated circuit chip 200. Tester controller 265 is essentially a computer system connected to the other components of tester 180 by interface devices and data ports. Tester controller 265 may contain an automatic test pattern generator (ATPG) which generates the test patterns supplied to test pattern unit 280 or, alternatively, tester controller may simply store pre-defined test patterns entered into the tester controller. Tester controller 265 also receives test results from integrated circuit chip 200. When ABIST and LBIST are used the test data indicates the type and location of the fail. When there is no ABIST or LBIST, a resultant test pattern is received which is used to generate a bit fail map of memory arrays and identify faults in logic circuits.

Also under the control of tester controller 265 is a temperature controller 185. Temperature controller 185 includes a control circuit 285, a heater 290 and a chiller 295. Temperature controller 185 may supply cooling or heating fluid to heat sink 220.

In operation test controller 265 monitors the temperature from heat sink sensor 230 or internal chip temperature sensor 235 via temperature sensor network 275 and the current drawn by integrated circuit chip 200 is measured by current measurement circuit 272 and voltage applied to integrated circuit chip 200 is measured by voltage measurement circuit 271. Tester controller 265 has the capability of limiting the current drawn by integrated circuit chip 200 via current limiting circuit 273. Test controller will also gate application of test patterns to the integrated circuit chip. The current flow, when no data pattern is being applied to integrated circuit chip 200, is essentially leakage current. Test controller 265 also controls the cooling or heating of heat sink 315 by temperature controller 185 in modes of operation requiring the temperature of integrated circuit 200 to be maintained at a pre-selected temperature, at a minimum temperature or at a maximum temperature, independent of applied test patterns or the asynchronous power supply. Temperature controller 185 includes a control unit 285, a heater 290 and a chiller 295. Heater 290 supplies hot liquid or gas to heat sink 315 at the direction of control unit 285. Chiller 295 supplies cold liquid or gas to heat sink 315 at the direction of control unit 285.

Figure 5:
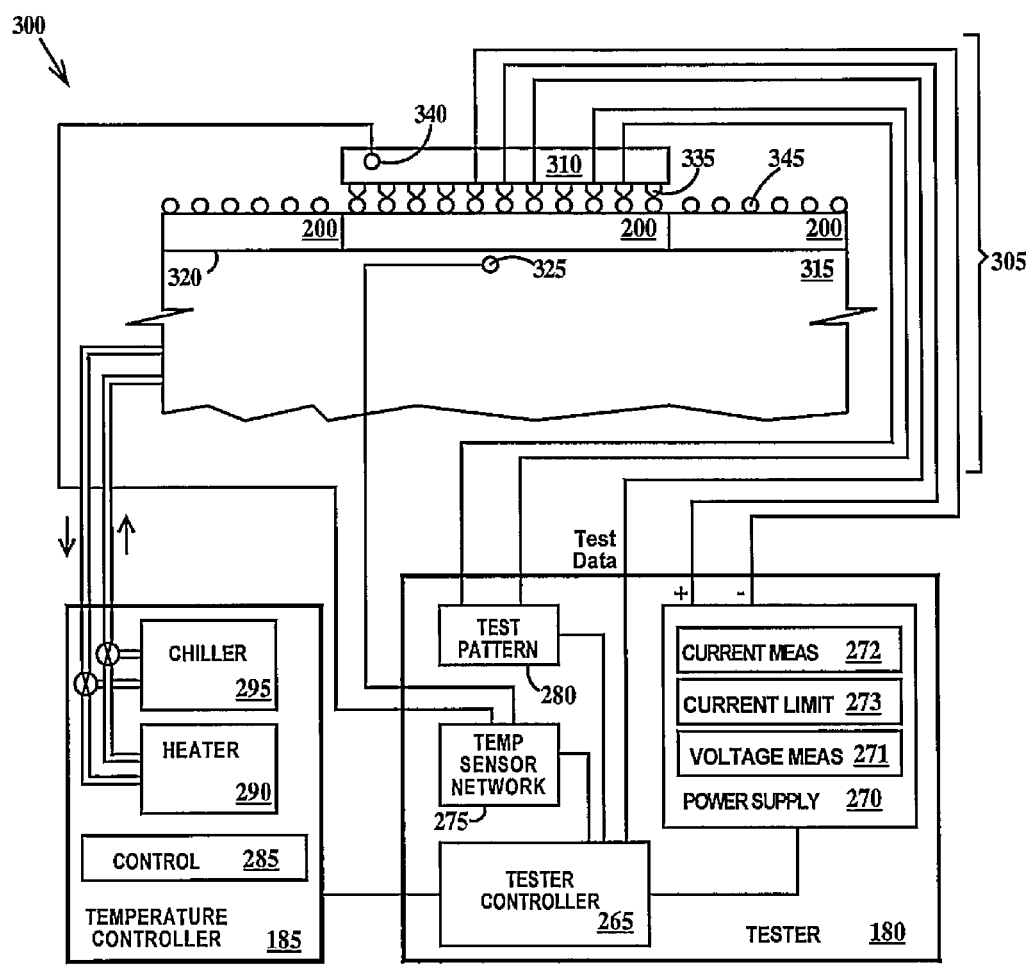
FIG. 5 is an exemplary diagram of a test apparatus for testing un-singulated integrated circuits according to embodiments of the present invention.

FIG. 5 is an exemplary diagram of a test apparatus 300 for testing un-singulated integrated circuits according to embodiments of the present invention. Test apparatus 300 includes a test head 305, tester 180 and temperature controller 185. In FIG. 5, an exemplary semiconductor wafer 310 includes a multiplicity of integrated circuit chips 200 to be tested is mounted on an XYZ wafer stage 315. Wafer stage 315 includes the capacity for circulating heating or cooling fluid through the wafer stage from temperature controller 185. A thermal transfer medium may be placed between wafer stage 315 and a bottom surface 320 of semiconductor wafer 315. Wafer stage 315 includes a stage temperature sensor 325. Each integrated circuit chip 200 may include an optional internal chip temperature sensor 340. A test probe 330 having an array of probe tips 335 contacts solder bumps 345 of chips 200. Hard physical and low resistance electrical contact is maintained between solder bumps 345 and probe tips 335 by upward pressure (Z direction) exerted by wafer stage 315 which can move in the X-Y directions to bring each integrated circuit chip 200 under probe 330 in turn. Other types of integrated circuit chips and corresponding probes may be substituted as is well known in the art. Tester 180 and temperature controller 185 operations have been described supra in reference to FIG. 4.

Figure 6:
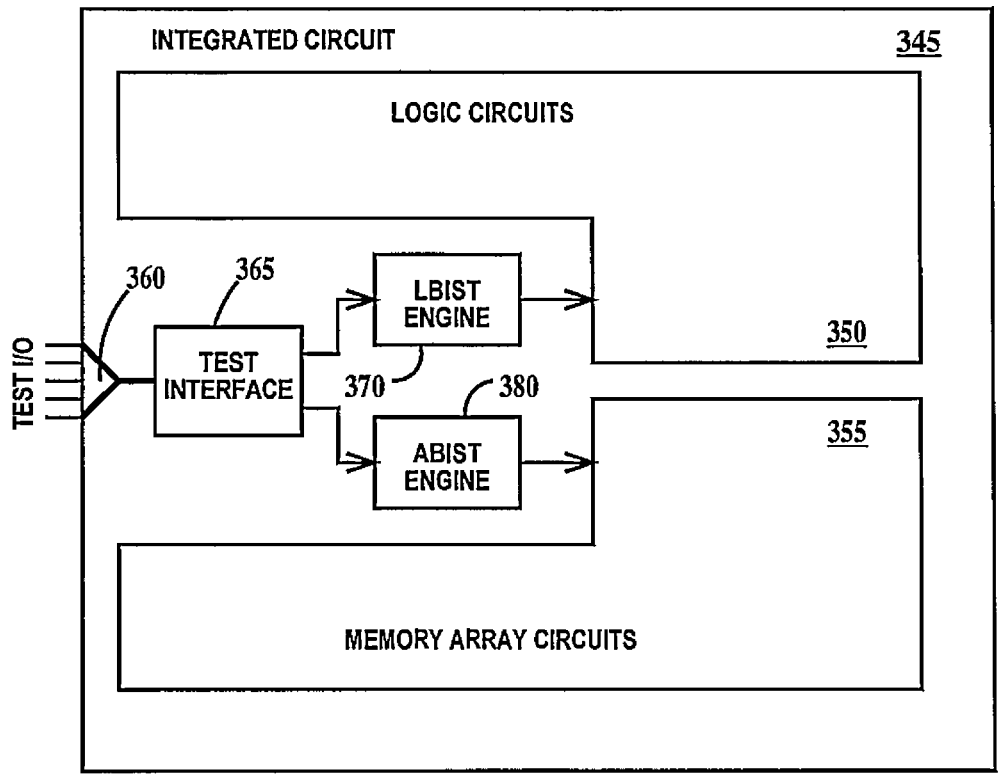
FIG. 6 is a diagram of an integrated circuit having built-in-self-test circuits.

FIG. 6 is a diagram of an integrated circuit having built-in self-test circuits. In FIG. 6, an integrated circuit chip 345 includes logic circuits 350, memory array circuits 355, a test I/O 360 connected to a test interface 365 connected to an LBIST engine 370 and an ABIST engine 380. LBIST engine 370 is connected to logic circuits 350 and ABIST engine is connected to memory array circuits 355. Logic circuits 350 are tested by LBIST engine 370, which includes a state machine that in a well known manner provides a preselected group of logic patterns to the logic circuits 350 under the control of off chip test vectors which can be programmed to sequence or hold the pattern generated (see FIG. 7). Off chip test patterns are applied via test I/O 360 to test interface 365. The test patterns setup and sequence the BIST state machine. An exemplary LBIST engine 370 is shown in commonly assigned U.S. Pat. No. 4,503,537 issued Mar. 5, 1985 and is hereby incorporated by reference.

ABIST engine 380 is programmed to provide various test patterns to the memory array 355 under the control of off chip test vectors which can be programmed to sequence or hold the pattern generated. Examples of memory arrays include, but are not limited to dynamic random access memory (DRAM), embedded DRAM (eDRAM), static random access memory (SRAM) and embedded SRAM (eSRAM). eDRAM and eSRAM are commonly found in microprocessors (e.g., as cache memory) and in application specific integrated circuits (ASICs). Exemplary ABIST engines are shown in commonly assigned U.S. Pat. No. 5,535,164 dated Jul. 9, 1996 and U.S. Pat. No. 5,563,833 dated Oct. 8, 1996 and hereby incorporated by reference.

While integrated circuit chip 345 includes both an LBIST engine and an ABIST engine, integrated circuit chip 345 may include either an LBIST engine or an ABIST engine, but not both.

Figure 7:
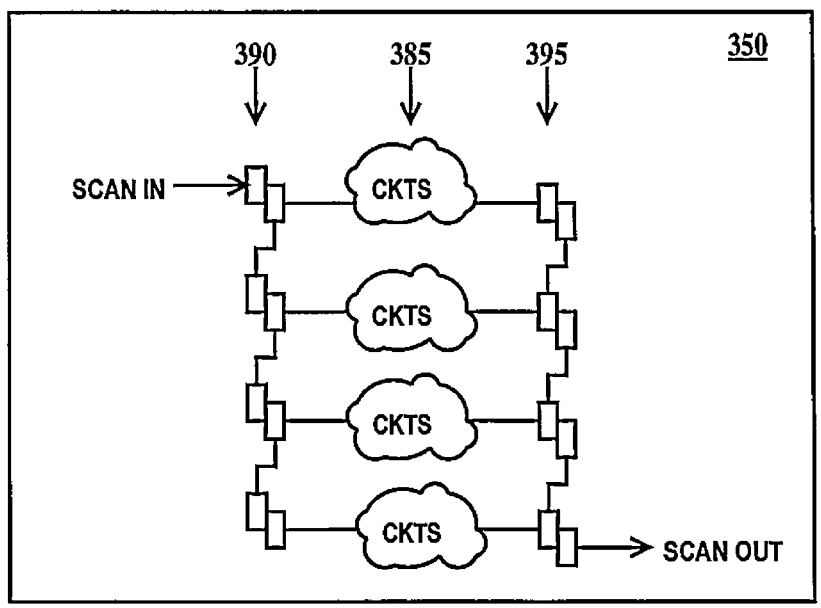
FIG. 7 is a diagram illustrating applying a test pattern to logic circuits.

FIG. 7 is a diagram illustrating applying a test pattern to logic circuits. In FIG. 7, logic circuit 350 includes logic circuits 385 connected between latches of a scan-in chain 390 and latches of a scan-out chain 395. LBIST engine 370 of FIG. 6 sequences test patterns into the latches of scan-in chain 390, next sequences the test pattern into logic circuits 385, next sequences a resultant pattern into the latches of scan-out chain 395, and finally sequences the resultant test pattern back to LBIST engine 370 and thence to a tester (such as tester 180 of FIGS. 4 and 5). FIG. 7 is an example of a level sensitive scan design (LSSD).

Figure 8:
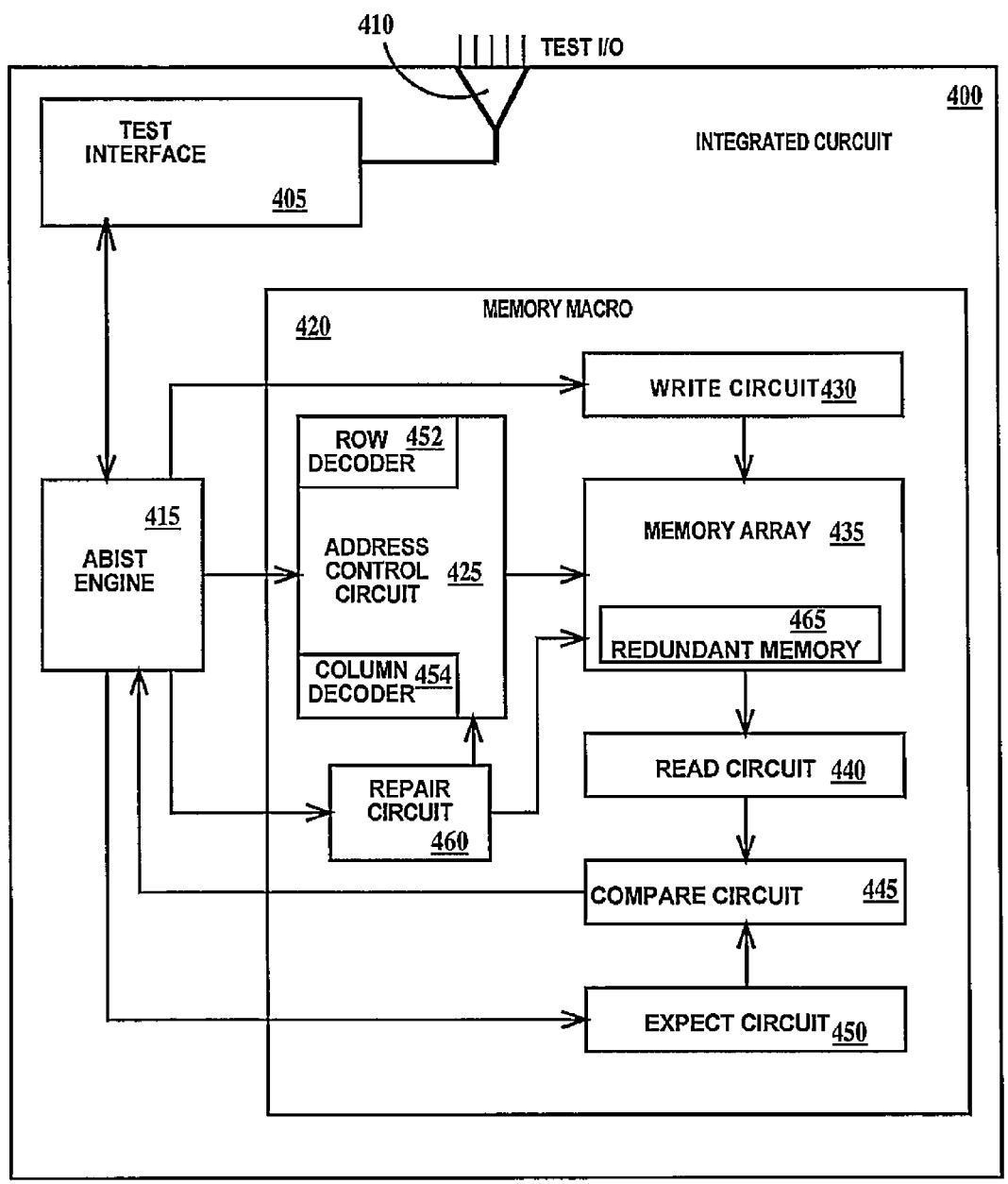
FIG. 8 is a diagram of an integrated circuit having memory array built-in-self-test circuits.

FIG. 8 is a diagram of an integrated circuit having memory array built-in self-test circuits. In FIG. 8, an integrated circuit 400 includes a test interface 405 connected between test I/O 410 and an ABIST engine 415. ABIST engine 415 is connected to a memory macro 420. Array macro 420 includes an address control circuit 425, a write data circuit 430, a memory array 435, a read data circuit 440, a compare circuit 445 and an expected data circuit 450. Address control circuit includes a row decoder 452 and a column decoder 454. Memory macro 420 may further include a repair circuit 460 and memory array may further include redundant memory 465.

ABIST engine 415 writes a test pattern to memory array 435 and an expected test pattern to expect circuit 450. Memory array 435 "writes" a resultant data pattern to read data circuit 440. Compare circuit 445 compares the resultant test pattern to the expected test pattern and determines a pass or fail condition for the test as well as locations of failing bits which is passed to ABIST engine 415 which reports the results of the test to the tester via tester interface 405. In one example, ABIST engine 415 is a general or special purpose processor that may be operable to generate test patterns and/or address vectors (address values) for writing and/or reading data to/from memory array 435. In one example, ABIST engine 415 is operable to transmit one or more control signals to memory macro 420 for controlling writing test patterns thereto, writing expected patterns thereto and/or reading test patterns therefrom.

In one example, write circuit 430 includes one or more scanable latches and may be operable to receive data from ABIST engine 415 and re-transmit this data to memory array 435. In one example, when a test pattern has been written to write data circuit 430 by the tester, the test pattern may be written to memory array 435 without receiving test pattern from ABIST engine 415. In one example, read data circuit 440 may also include one or more scanable latches and may be operable to receive a resultant test pattern from memory array 435 and re-transmit this data to ABIST engine 415.

In one example, address control circuit 425 is operable to receive address data from ABIST engine 415 and, upon receiving suitable control signal(s) from ABIST engine 415, or other device(s), transmit address data to row decoder 452 and/or column decoder 454, to either write data to, or read data from, memory array 435. Memory array 435 may include a grid of memory cells that are organized into rows and columns as is well known in the art.

When memory macro 420 includes repair circuit 460 and memory array 435 includes redundant memory 465 (e.g., redundant rows of memory cells) repair circuit may be directed to repair failing memory elements (e.g., failing rows of memory) with redundant memory elements (e.g., redundant rows of memory cells).

Figure 9:
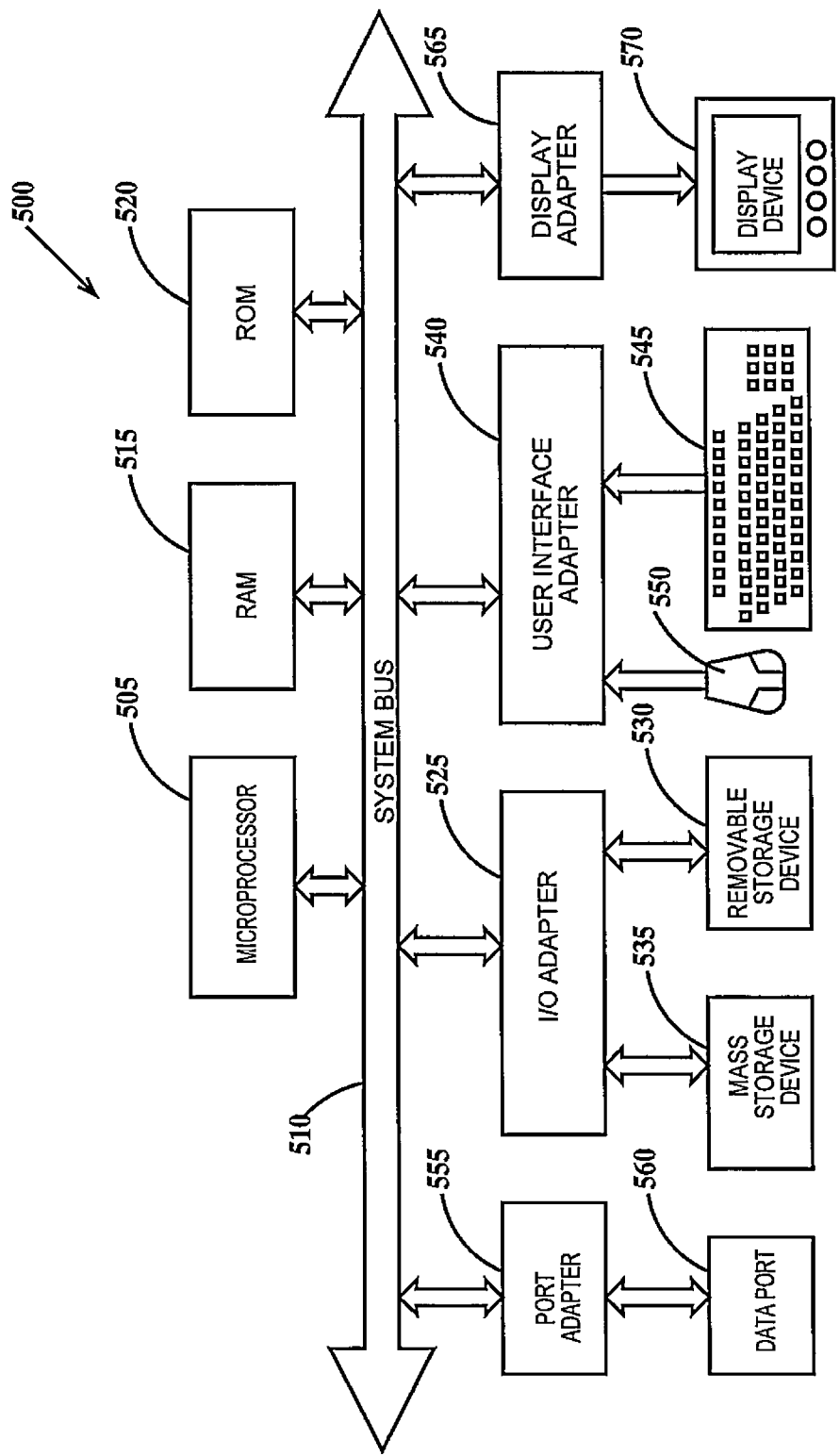
FIG. 9 is a schematic block diagram of a computer portion of a tester for practicing embodiments of the present invention.

FIG. 9 is a schematic block diagram of a computer portion of a tester for practicing embodiments of the present invention. Generally, the method described herein with respect to a method for reliability testing integrated circuits is practiced with a computer linked to or included in a test system and the methods described supra in the flow diagrams FIGS. 1 and 2 may be coded as a set of instructions on removable or hard media for use by the computer.

In FIG. 9, computer 500 has at least one microprocessor or central processing unit (CPU) 505. CPU 505 is interconnected via a system bus 510 to a random access memory (RAM) 515, a read-only memory (ROM) 520, an input/output (I/O) adapter 525 for connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570. The tester may be connected to computer system 500 through an additional port adapter 555.

ROM 520 contains the basic operating system for computer 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 530, fed through data port 560 or typed in using keyboard 545.

Thus, the embodiments of the present invention provide efficient methods of and apparatus for corner testing integrated circuit chips.

What is claimed is:

1. A method, comprising:
   selecting a clock frequency, a temperature range and a power supply voltage range for margin testing an integrated circuit wherein one or more of said clock frequency, said temperature range and said power supply voltage range includes a value that is outside of the normal operating conditions of said integrated circuit;
   applying an asynchronously time varying power supply voltage set to said selected power supply voltage level to said integrated circuit, wherein rising edges of said asynchronously time varying power supply voltage are not synchronous to rising edges of a clock signal used to clock a continuous test pattern into said integrated circuit;
   running said integrated circuit chip at said selected clock frequency and maintaining said integrated circuit within said selected temperature range;
   clocking said continuous test pattern to said integrated circuit; and
   determining if a failure of said integrated circuit has occurred in response to said test pattern.

2. The method of claim 1, where margin testing is performed with (i) said clock frequency and said temperature or (ii) said clock frequency and said power supply voltage level or (iii) said temperature range and said power supply voltage level or (iv) said temperature range and said clock frequency or (v) said clock frequency, said temperature range and said power supply voltage level are outside of said normal operating conditions.

3. The method of claim 1, wherein said asynchronous time varying power supply voltage has a periodic maximum voltage duration that is less than a thermal time constant of a semiconductor material of said integrated circuit and selected to keep the operating temperature of said integrated circuit between a pre-defined minimum temperature and predefined maximum temperature.

4. The method of claim 3, wherein the thermal time constant ($\tau$) is given by:

$$\tau = [2F/\pi]^2 [\rho C/K_{TH}]$$

where:
F=thickness of the semiconductor material;
$\rho$=density of the semiconductor material;
C=specific heat of the semiconductor material; and
$K_{TH}$=thermal conductivity of the semiconductor material.

5. The method of claim 1, wherein said asynchronous time varying power supply voltage varies between a predefined minimum voltage and a predefined maximum voltage, said predefined maximum voltage greater than said predefined minimum voltage, said predefined minimum voltage is the nominal operating voltage of said integrated circuit, said predefined minimum voltage and said predefined maximum voltage are greater than zero.

6. The method of claim 1, wherein said asynchronous time varying power supply voltage consists of sequential periods, each period comprising a same maximum voltage and a same time duration and a same minimum voltage and a same time duration.

7. The method of claim 1, further including:
   recording, on a test apparatus, the location and type of fails based on comparing an expected pattern, generated by said integrated circuit in response to said continuous test pattern, to a resultant pattern received from said integrated circuit.

8. The method of claim 1, further including:
   replacing failing rows of memory cells of said integrated circuit with redundant rows of memory cells of said integrated circuit.

9. The method of claim 1, wherein said continuous test pattern is applied to a memory array of said integrated circuit.

10. The method of claim 1, wherein said continuous test pattern is applied to a logic circuit of said integrated circuit.

11. The method of claim 1, wherein said continuous test pattern is generated by an automatic test program generator of a tester connected to said integrated circuit.

12. The method of claim 1, further including:
    generating said continuous test pattern in an automatic built-in self test engine of said integrated circuit, said automatic built-in self test engine applying said continuous test pattern to a memory array of said integrated circuit; and
    receiving resultant test information from said memory array by said automatic built-in self test engine.

13. The method of claim 1, further including:
    generating said continuous test pattern in an logic built-in self test engine of said integrated circuit, said logic built-in self test engine applying said continuous test pattern to a logic circuit of said integrated circuit; and
    receiving resultant test information from said memory array by said logic built-in self test engine.

14. A test apparatus, comprising:
    a tester configured to apply an asynchronously time varying power supply voltage set to a selected power supply voltage range to an integrated circuit, wherein rising edges of said asynchronously time varying power supply voltage are not synchronous to rising edges of a clock signal used to clock a continuous test pattern into said integrated circuit, (ii) configured to run said integrated circuit at a selected clock frequency range, configured to maintain said integrated circuit within a selected temperature range, and (iii) configured to apply said continuous test pattern to said integrated circuit;

wherein one or more of said selected clock frequency range, said selected operating temperature range and said selected power supply voltage range includes a value that is outside of the normal operating conditions of said integrated circuit; and said tester configured to compare an expected pattern, generated by said integrated circuit in response to said continuous test pattern to a resultant pattern received from said integrated circuit.

15. The test apparatus of claim 14, where said tester is configured to perform margin testing with (i) said clock frequency and said temperature range or (ii) said clock frequency and said power supply voltage level or (iii) said temperature range and said power supply voltage level or (iv) said temperature range and said clock frequency or (v) said clock frequency, said temperature range and said power supply voltage level are outside of said normal operating conditions.

16. The test apparatus of claim 14, wherein said asynchronous time varying power supply voltage has a periodic maximum voltage duration that is less than a thermal time constant of a semiconductor material of said integrated circuit and selected to keep the operating temperature of said integrated circuit between a pre-defined minimum temperature and predefined maximum temperature.

17. The test apparatus of claim 16, wherein the thermal time constant ($\tau$) is given by:

$\tau = [2F/\pi]^2 [\rho C/K_{TH}]$ where:
   F=thickness of the semiconductor material;
   $\rho$=density of the semiconductor material;
   C=specific heat of the semiconductor material; and
   $K_{TH}$=thermal conductivity of the semiconductor material.

18. The test apparatus of claim 14, wherein said asynchronous time varying power supply voltage varies between a predefined minimum voltage and a predefined maximum voltage, said predefined maximum voltage greater than said predefined minimum voltage, said predefined minimum voltage is the nominal operating voltage of said integrated circuit, said predefined minimum voltage and said predefined maximum voltage are greater than zero.

19. The test apparatus of claim 14, wherein said asynchronous time varying power supply voltage consists of sequential periods, each period comprising a same maximum voltage and a same time duration and a same minimum voltage and a same time duration.

20. The test apparatus of claim 14, further including:
   a repair circuit configured to replace failing rows of memory cells of said integrated circuit with redundant rows of memory cells of said integrated circuit.

21. The test apparatus of claim 14, wherein said continuous test pattern is applied to a memory array of said integrated circuit.

22. The test apparatus of claim 14, wherein said continuous test pattern is applied to a logic circuit of said integrated circuit.

23. The test apparatus of claim 14, wherein said continuous test pattern is generated by an automatic test program generator of said tester.

24. The test apparatus of claim 14, wherein said continuous test pattern is generated by an automatic built-in self test engine of said integrated circuit, said built-in self test engine configured to apply said continuous test pattern to a memory array of said integrated circuit and receive resultant test information from said memory array.

25. The test apparatus of claim 14, wherein said continuous test pattern is generated by a logic built-in self test engine of said integrated circuit, said logic built-in self test engine configured to apply said continuous test pattern to a logic circuit of said integrated circuit and receive resultant test information from said logic circuit.

* * * * *